United States Patent [19]
Nathanson

[11] Patent Number: 5,969,385
[45] Date of Patent: Oct. 19, 1999

[54] ULTRA-LOW POWER-DELAY PRODUCT NNN/PPP LOGIC DEVICES

[75] Inventor: Harvey C. Nathanson, Pittsburgh, Pa.

[73] Assignee: Northrop Grumman Corporation, Los Angeles, Calif.

[21] Appl. No.: 08/689,946

[22] Filed: Aug. 16, 1996

Related U.S. Application Data

[60] Provisional application No. 60/002,399, Aug. 17, 1995.
[51] Int. Cl.[6] ........................... H01L 27/01; H01L 29/76; H01L 27/12; H01L 31/0392
[52] U.S. Cl. ......................... 257/347; 257/403; 257/348; 257/351
[58] Field of Search ................................... 257/410, 402, 257/403, 347, 348, 351, 468

[56] References Cited

U.S. PATENT DOCUMENTS 5,111,260  5/1992  Malhi et al. .............................. 257/347

FOREIGN PATENT DOCUMENTS 63-283056  11/1988  Japan ..................................... 257/347
2-14579    1/1990   Japan ..................................... 257/347
WO 9415364  7/1994   WIPO ..................................... 257/347

OTHER PUBLICATIONS

XP 002047484–"A High Performance Low Temperature 0.3 $\mu$m CMOS on Simox", Shahidi, G.G. et al., Jun. 2, 1992, pp. 106–107.
Copy of Foreign Search Report.
Patent Abstracts of Japan, Y Kazuo, Sep. 17, 1990.
Tunneling Gate Oxide Approach to Ultra–High Current Device in Small Geometry MOSFETS, Momose, et al, published in *IEEE*, Dec., 1994.

*Primary Examiner*—Steven H. Loke

[57] ABSTRACT

Transistors have source, drain and channel regions all of the same conductivity type. The channel region is very thin, not more than about 500 Å and preferably about 300 Å or even 100 Å in thickness. A very thin oxide layer having a thickness of much less than about 100 Å, such as 20 Å and preferably about 5 to about 10 Å, isolates a gate electrode from the channel region. When operated at temperatures at or below 150° K, such as 77° K, very low threshold voltages, well below 25 millivolts, are achieved. Gigahertz speed complementary MOS transistors, formed by adjacent NNN and PPP devices exhibit power-delay products of about 1E-16 joules operating at supply voltages on order 100 millivolts or lower, making this technology of particular interest for multi-gigahertz processing rates at very low power.

17 Claims, 5 Drawing Sheets

ULTRA-LOW POWER-DELAY PRODUCT NNN/PPP LOGIC DEVICES

This application claims the benefit of U.S. Provisional Application No. 60/002,399 filed Aug. 17, 1995.

BACKGROUND OF THE INVENTION

1. Field of the Invention

This invention is directed to very thin gate oxide semiconductor devices having source, drain and channel regions all doped with dopants of the same conductivity type, and to complementary devices in which the three regions of one device are all of the same conductivity type, but opposite to the conductivity type of the three regions of the other device.

2. Background Information

Conventional complementary metal oxide silicon (CMOS) transistors have source and drain regions of the same conductivity type with a channel region between of the opposite conductivity type. Thus, one transistor is a npn device and the complementary transistor is a pnp type. These devices have a threshold voltage which is typically about 500 to 1500 millivolts. Furthermore, the capacitance of such devices is high due in part to an oxide layer of about 100 to 500 Angstroms (Å) in thickness insulating the gate electrode from the channel region. Since the power required by these devices and their switching speed are both direct functions of the capacitance and threshold voltage, they are relatively power hungry and slow for certain applications.

One such application is an interface between high temperature superconducting (HTSC) circuits, typically operating at 77° K, and conventional silicon devices operating at ambient conditions (300° K). The HTSC circuits potentially have P * Tau (power-delay) product capabilities as low as the 1E-17 to the 1E-16 joule level. Because of the relatively high threshold voltages and slow response times of conventional silicon NPN/PNP logic families, they themselves do not approach such power-delay products, and hence, are a poor match to serve as glue circuits for the HTSC families.

There is a need therefore, in general, for higher speed, significantly lower power semiconductor devices, and there is a particular need for such a device which can serve for instance as an interface between HSTC circuits and ambient silicon devices.

In this connection, there is a need for improved semiconductor devices which have lower threshold voltages, and particularly well below about the 100 millivolt level.

SUMMARY OF THE INVENTION

These needs and others are satisfied by the invention which is directed to a semiconductor device comprising a substrate, an active layer on the substrate having spaced apart source and drain regions, both of the same conductivity type, and the channel region between the source and drain regions, also of the same conductivity type. A key feature is that the channel region is no more than about 500 Å thick and preferably only about 100 Å thick. An oxide layer is provided between the channel region and a gate electrode. Another important feature of the invention is that this oxide layer is no more than about 100 Å thick, but more likely only about 20 Å thick, and preferably between about 5 and 10 Å in thickness. The devices are adapted for operation at temperatures which pin the Fermi level near or at the majority dopant level, thus, temperatures from less than about 150° K to about 77° K. Electrodes are also provided for the source and drain regions. Complementary devices are provided by one such device in which the source, the channel, drain regions are N+, N, N+ and an adjacent P+, P, P+ device.

Preferably, an oxide layer is provided between the substrate and the active layer to more easily establish the thickness of the channel region. Preferably, the active layer is silicon, although other materials with MOS properties such as silicon carbide, and gallium arsenide can be used. As is known, doped polysilicon can be used in place of metal for the electrodes, including the gate electrode.

The thinness of the channel region between the source and drain keeps the current which flows at a zero value of gate voltage to a minimum. It can be shown that ON/OFF ratios of 100 or more can be easily met by a combination of a 200 Å thick channel region between the source and drain regions and the fact that a small reverse bias on the gate electrode (a few millivolts) depletes the channel in the channel region completely, forcing the current to near zero at the origin of the VI (voltage/current) curve.

In a preferred form of the invention, the channel region has a dopant-thickness product of about 3 to 10E10 charges/$cm^2$. Also, the length of the bulk region, between the source and drain regions, is from about 500 Å to 2500 Å and preferably about 1250 Å.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
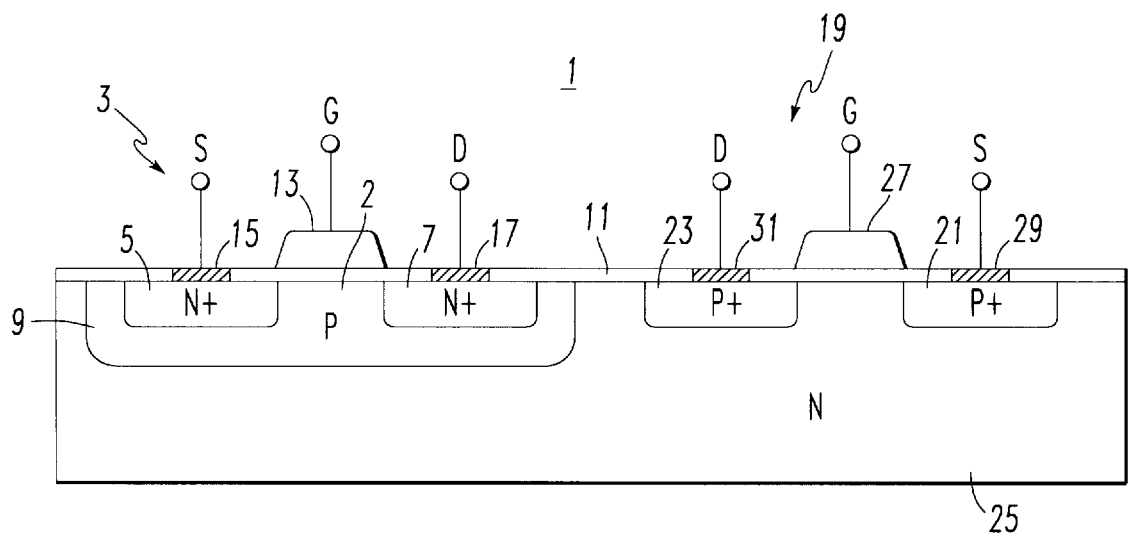
FIG. 1 is a diagram of a prior art CMOS device.

In order to better understand the invention it is helpful to consider first a conventional CMOS device 1 such as shown in FIG. 1. This device 1 includes an npn transistor 3 formed by N+ source and drain regions 5 and 7 and a P region 9. A thin oxide layer 11 extends over the source, channel and drain regions. Typically, this oxide layer 11 is 100 Å to 500 Å thick. A metal or polysilicon gate electrode 13 is isolated from the channel region 9 by the oxide layer 11. Source and drain electrodes 15 and 17, respectively, are positioned through the oxide layer 11 over the source and drain regions.

Figure 2:
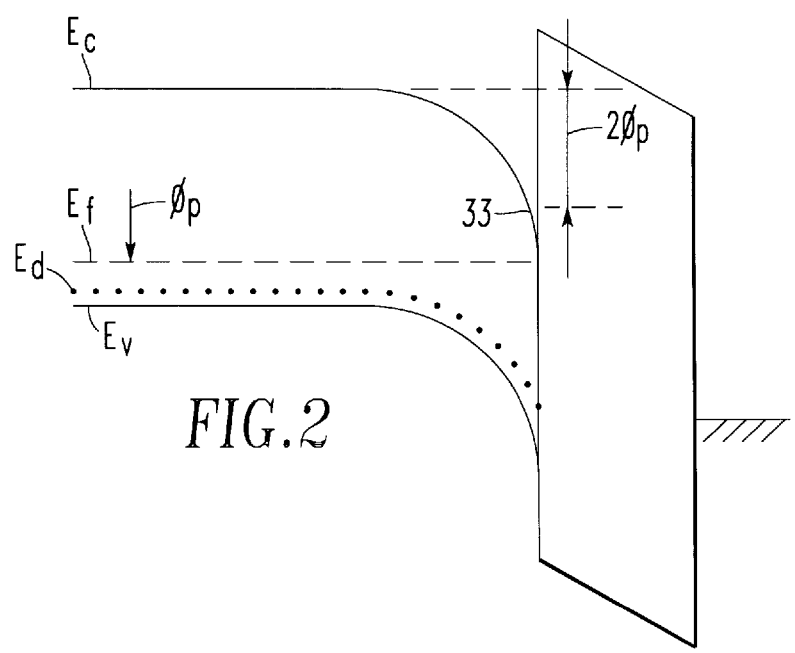
FIG. 2 is an energy level diagram for the prior art CMOS device of FIG. 1.

A complementary PNP transistor 19 adjacent to the end NPN transistor 3 includes P+ source region 21 and drain region 23 separated by an N type substrate 25. The oxide layer 11 extends over these regions and insulates a gate electrode 27 from the channel region formed by the substrate 25. Electrodes 29 and 31 positioned through the oxide layer 11 form source and drain electrodes, respectively. FIG. 2 is a Fermi diagram for the NPN transistor portion of FIG. 1. In this diagram, $E_c$ is the conduction band, $E_v$ is the valence band, $E_d$ is the donor level, and $E_F$ is the Fermi level. The p doping of the p region 9 in the NPN device 3 leads to a high threshold voltage shown by the fact that the onset of current requires that the conduction and valence bands bend as indicated at point 33 by $2\phi_p$ which is typically about 0.5 to 0.75 volts. As mentioned above, this high turn-on gate voltage makes the device 3 power hungry and slow, since the gate capacitance has to be charged up to an order of $2\phi_p$ volts.

Figure 3:
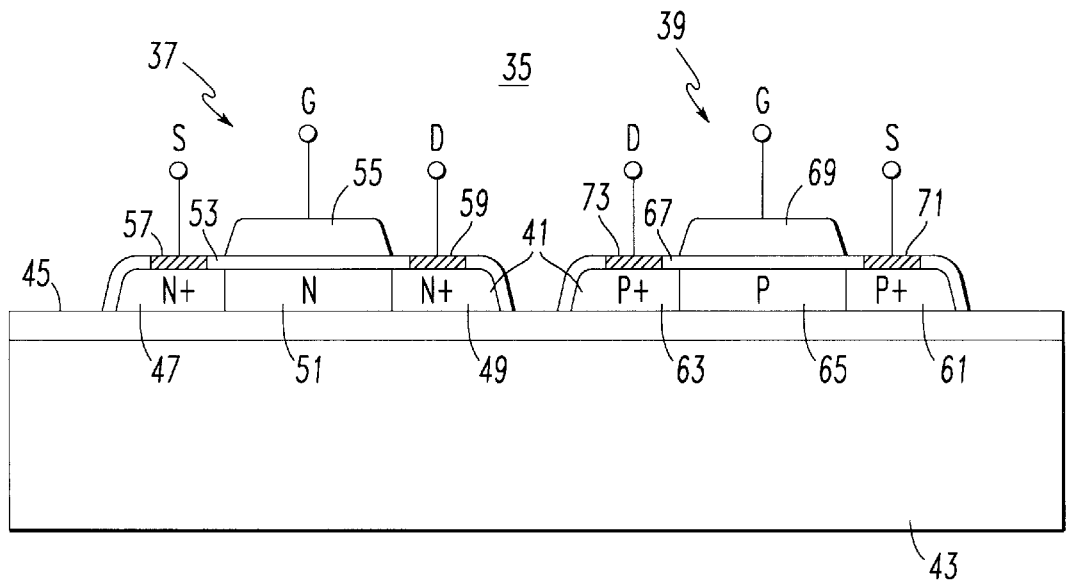
FIG. 3 is a section through a semiconductor device in accordance with the invention.

In contrast to the conventional CMOS devices of FIG. 1, the present invention is directed to devices which utilize the same conductivity type of material for the source, drain, and channel regions. Thus, as shown in FIG. 3, a complementary device 35 includes an NNN transistor 37 and a PPP transistor 39 formed side-by-side in an active layer 41 formed on a substrate 43. Preferably, an oxide layer 45 is provided between the substrate 43 and the active layer 41. The NNN device 37 is formed by an N+ source region 47 and an N+ drain region 49 spaced apart in the active layer 41 by the N channel region 51. A thin oxide layer 53 insulates a gate electrode 55 from the channel region 51. The oxide layer 53 also extends over the source and drain regions 47 and 49 where source and drain contacts 57 and 59, are formed, respectively.

The PPP device 39 includes a P+ source region 61 and a P+ drain region 63 in the active layer 41 separated by a P channel region 65. As in the case of the NNN device, a thin oxide layer 67 insulates a gate electrode 69 from the channel region 65 and extends across the source and drain region 61 and 63 where a source electrode contact 71 and a drain electrode contact 73 are formed.

Figure 4:
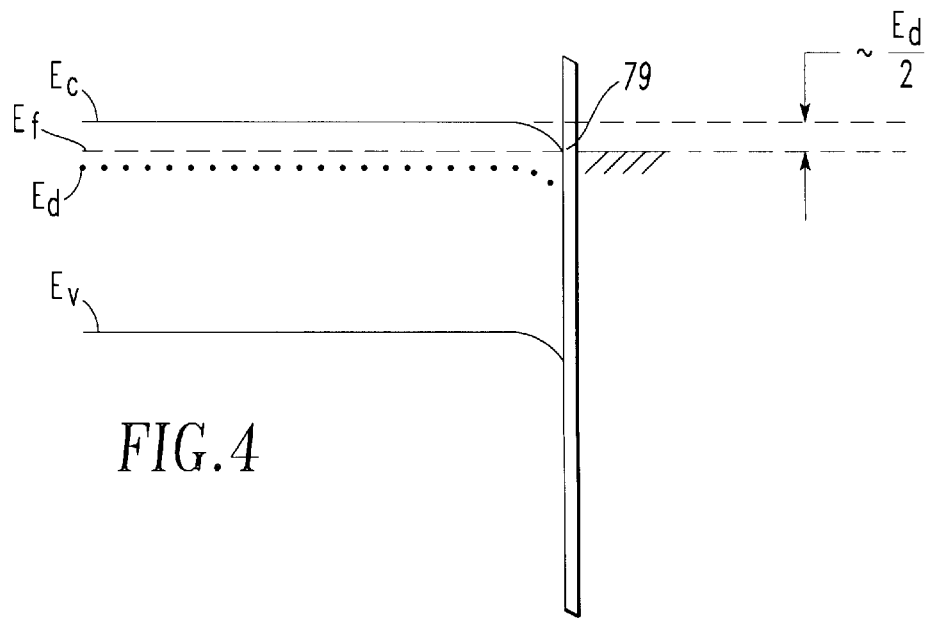
FIG. 4 is an energy diagram for the NNN device in accordance with the invention.
Figure 5:
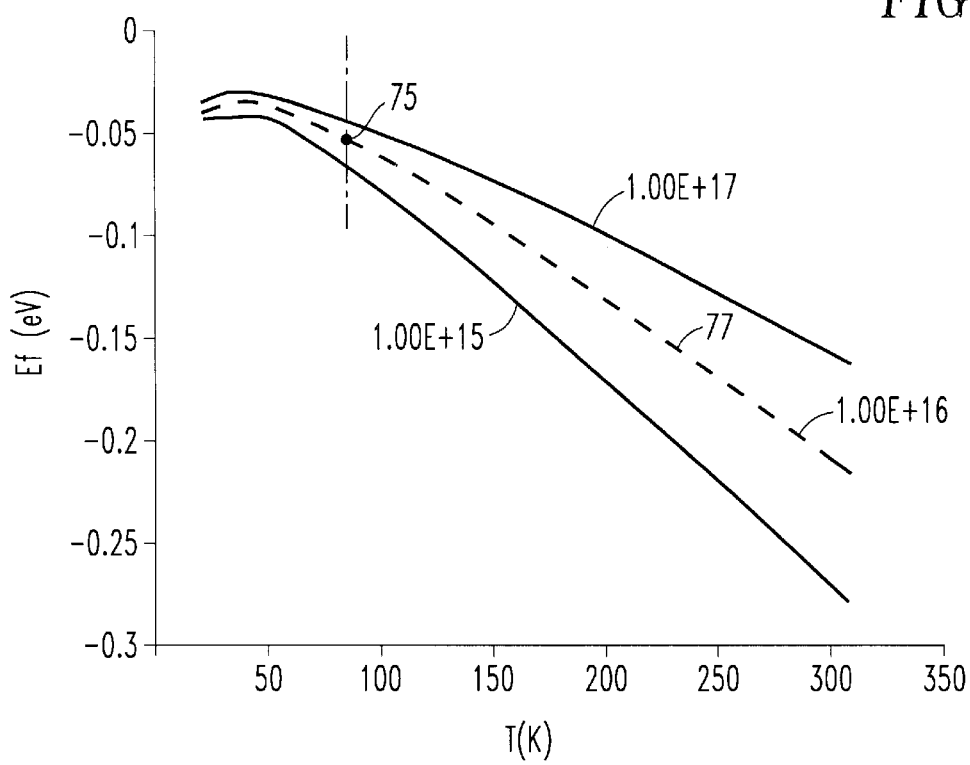
FIG. 5 is a plot of the Fermi level versus temperature for several doping levels of the channel region of a device in accordance with the invention.

The channel regions 51 and 65 are very thin; namely, less than about 500 Å in thickness and preferably only about 300 Å, but even about 100 Å. The oxide layers 53 and 67 are also very thin; namely not more than about 100 Å but more like 20 Å and preferably 5 to 10 Å. The length of the channel regions 51 and 65, between the source and drain regions is between about 500 to 2500 Å and preferably about 500 to 1500 Å with 1250 Å being suitable. Preferably the active layer 41 is silicon into which the source and drain region are diffused and separated by photolithography techniques to form the channel regions. However, other materials exhibiting MOS activity such as silicon carbide and gallium arsenide could be utilized. The source and drain regions 49, 63 and 47, 61 in the illustrative device are doped to about 1E20 charges/cm³. The channel regions 51 and 65 can be doped to levels of about 1E+16 charges per cm³ to produce dopant-thickness products in the range of about 3 to about 30E+10 charges per cm². As shown by the Fermi diagram of FIG. 4 for NNN device 37, the voltage drop required to move the Fermi level $E_f$ to the onset of conduction $E_c$ does not contain the $2\phi$ voltage term. In particular, with the channel regions 51 and 65 doped to about the 1E16/cm³ range, the Fermi level at 77 K just about sits on the donor level $E_d$, which is only about 50 milli-electron volts away from the conduction band $E_c$ for phosphorous as can be seen in FIG. 5 at the point 75 for the 1E+16 dopant curve 77. It is a key principle of the invention that the temperature is used to pin the Fermi level $E_f$ near or at the majority dopant level $E_d$ in FIG. 4, a known small distance from the majority carrier band edge where it is ready to cause conduction with the smallest of applied surface fields The onset of gate voltage for conduction is then the band bending at 79 which is equal to about $E_d/2$ volts, a much smaller value than the $2\phi$ volts required by the conventional CMOS devices as shown in FIG. 2.

The following equation shows the components for the threshold voltage in a conventional MOS transistor:

$$V_T = 2\phi_{FO} + \frac{Qsc}{C_{ox}} + \Delta V_{WF} \qquad \text{Eq. (1)}$$

The first term is the band bending voltage drop which for an NPN transistor is about 0.8 volts. The second term is the space charge voltage drop which is typically about 1 volt. The final term is the work function difference voltage drop which can be made negligible with proper adjustment of the gate metal or polysilicon work function. Thus, the threshold voltage for the typical conventional MOS device can be as high as about 1.8 volts.

For an NNN device in accordance with the invention, the threshold voltage for conduction is:

$$V_T^* = \frac{E_c - E_d}{2} \qquad \text{Eq. (2)}$$

Comparing Equation 2, to Equation 1 above, it can be seen that the second and third terms of Equation 1 are absent in an NNN or PPP device and the first term, $2\phi$ of Equation 1, is replaced in Equation 2 by only the minuscule band bending associated with the small movement of the Fermi level from $E_d$ to the conduction band edge $E_c$, a few tens of millivolts. It should be noted that the imposition of the oxide layer 53, 67 between the gate 55, 69 and the channel region 51, 65 usually doubles this contribution for oxides as thin as 20 Å or so. Thicker oxide layers can be deleterious to a small threshold voltage.

Figure 6A:
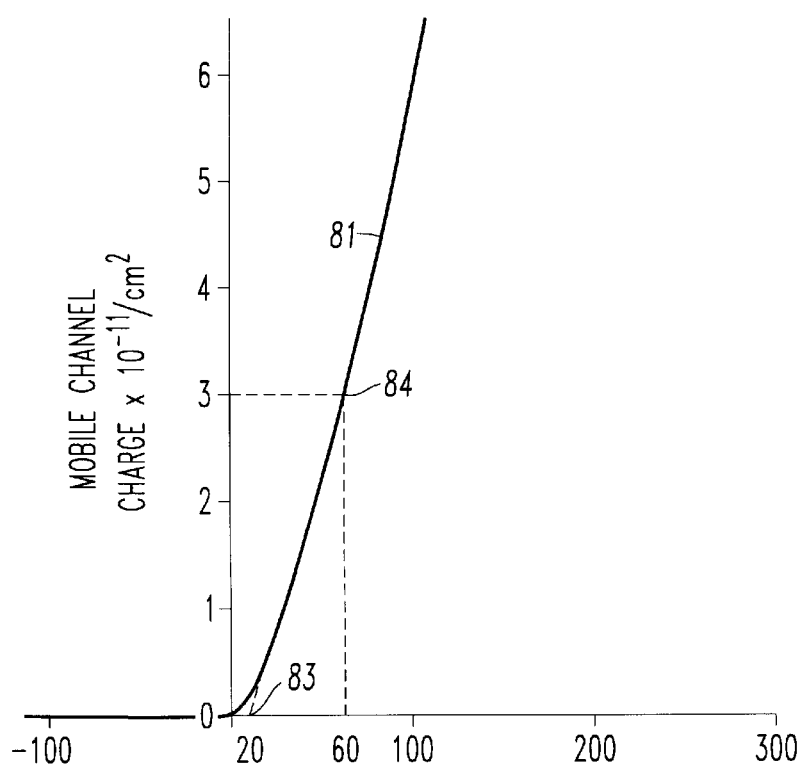
FIG. 6a is a plot of mobile charges per square centimeter versus gate voltage illustrating the threshold voltage of an NNN device in accordance with the invention.
Figure 6B:
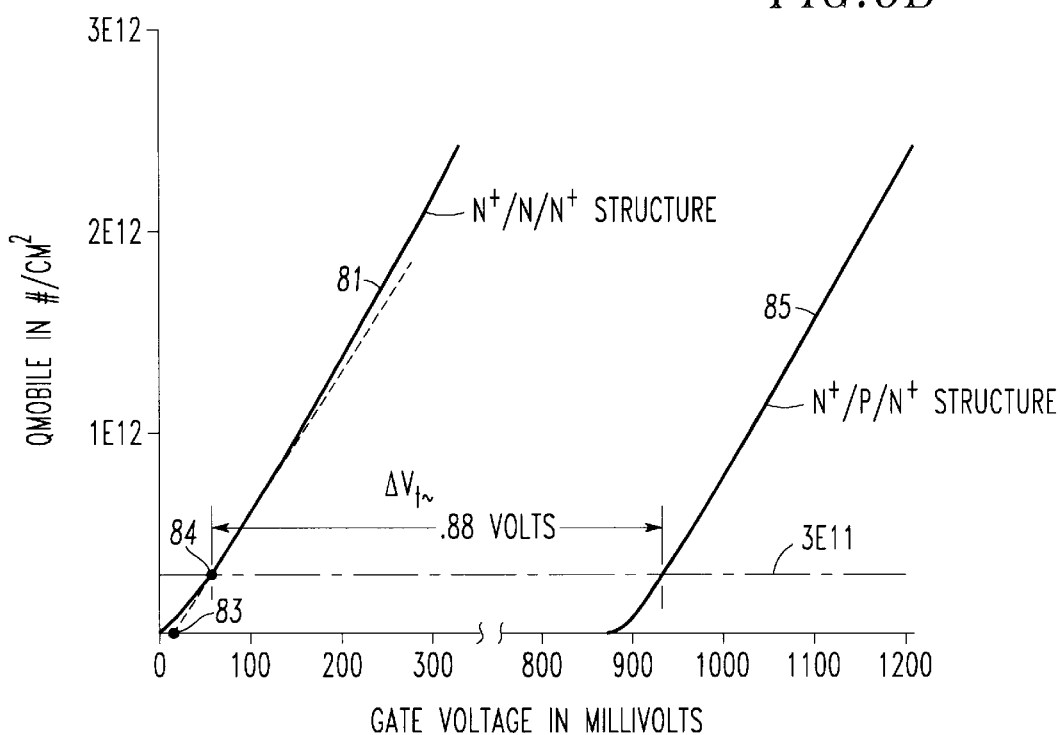
FIG. 6b is a similar plot on a smaller scale illustrating a comparison of the threshold voltage of the NNN device with that of a conventional NPN device.

Thus, it is expected that a thin oxide NNN device with threshold voltages on the order of the donor energy, $E_d$, can be achieved, yet it can still be expected, with low oxide fields, to drive the Fermi level into the conduction band where high currents and high speeds occur. In FIG. 6a is shown the results 81 of a graphical calculation of the mobile carriers in an NNN transistor versus gate voltage where the oxide layer 53 was 20 Å thick and the temperature 77 K. The bulk region 51 was doped to 1E16/cm³ and 200 Å thick. Note that the current starts almost immediately from the origin, with a non-linearity that seems to indicate a threshold gate voltage of about 20 millivolts at 83. As important as the low threshold is the fact that at only 60 millivolts total on the gate a channel electronic conduction layer of 3E11 carrier/cm² is achieved at 84, a large value for such a low gate voltage. Contrast this behavior with the curve 85 in FIG. 6b for a 20 Å thick oxide layer and temperature of 77 K for a 1E16/cm³ conventional thick channel region NPN device. Curve 81 for the NNN device is also included in FIG. 6b for comparison. The $2\phi$ plus the space charge term of Equation 1 drives the turn-on voltage of the conventional thick channel region NPN device, curve 85, to the right in FIG. 6b resulting in a difference in threshold voltage of about 880 millivolts, even with a 20 Å thin oxide in the NPN device. This essentially ruins the NPN/PNP system for being able to achieve 100 millivolt supply voltage logic.

There are ways in the literature to adjust threshold voltages in MOST devices. However, adjusting the threshold voltage to an accuracy of around a fraction of tens of millivolts with either 1) ion implantation, or 2) separate substrate voltage manipulation (as is recently known in the art), will not effectively permit the precise control of the overall chip threshold voltages to such accuracy as the NNN/PPP devices discussed herein where the discussion is in terms of eliminating the root causes of the large threshold voltages and especially their dependance on the inevitable non-uniformity of substrate doping that occurs across the wafer during fabrication. Both the fact that an N/N/N structure is utilized, and that both the oxide and the silicon layers are so thin greatly decreases the sensitivity of the threshold voltage to the substrate doping.

Figure 7:
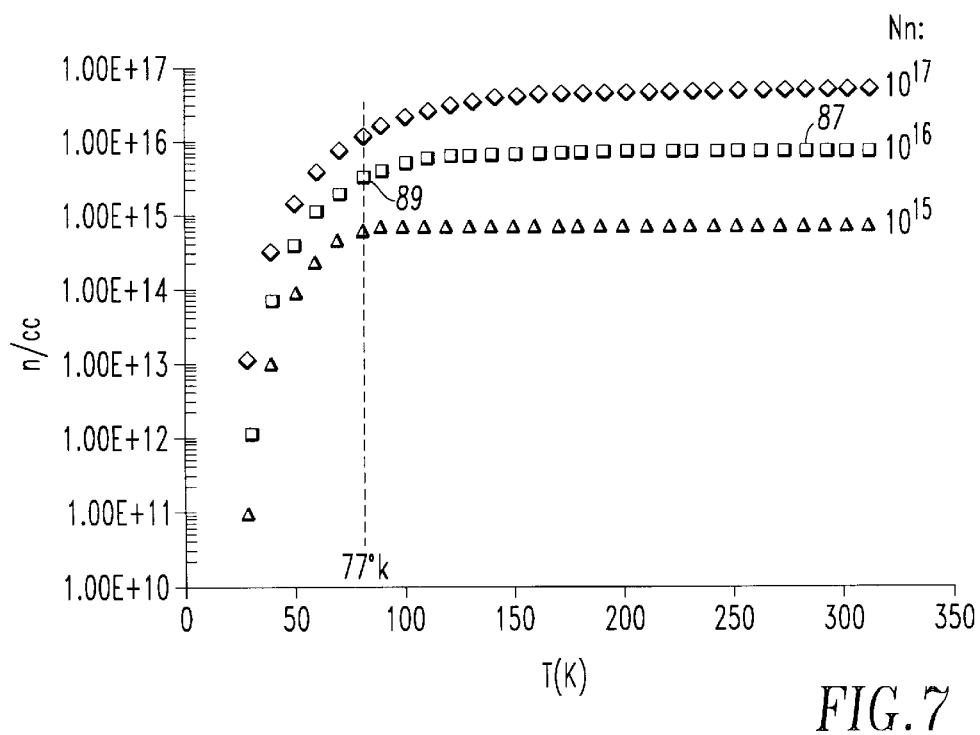
FIG. 7 is a plot of electron concentration versus temperature for several doping levels of the channel material in an NNN device of the invention.

FIG. 7 which is a plot of the electron concentration versus temperature for three levels of doping of the channel region, deals briefly with the fact that at 77 K, $1E16/cm^3$ material shown by the trace 87 partially deionizes at the point 89. This helps in two ways: 1) it is this deionization which helps pin the Fermi level near $E_d$, close to the conduction band edge "ready to go", 2) the channel region 51 in FIG. 3 is now less conducting, raising the on-to-off ratio of the device. As mentioned above, this is not of extreme importance when the $1E16/cm^3$ material is so thin (100 Å to 200 Å) such that a few negative millivolts on the gate completely depletes the substrate shutting off the current and making the on-to-off ratio extremely high.

Additionally, note that when the silicon thickness of layer 41 in FIG. 3 is made much thinner than the Debye length associated with the dopant $N_o$ of the channel layer of the NNN device, where the Debye length is well-known in the semiconductor literature, then the threshold voltage of the NNN devices becomes rather insensitive to both the thickness of layer 41 and its exact n doping level. This makes the device significantly easier to fabricate reproducibly than might be expected from fabrication of thick base channel region MOS devices (~1000 Å+) presently known to the art.

The following is a calculation of the operating capabilities (drain current I, transconductance $g_m$, capacitance C and operating frequency $f_{oper}$) of an N+/N/N+ transistor having an N type channel mobility $\mu_n$ of 2000 cm$^2$/volt sec (at 77° K), a charge q, a channel length L of 0.25 microns, a channel width W of 5.0 microns and a gate oxide with a thickness $W_{ox}$ of 20 Å and dielectric constant $\epsilon_{ox}$ of 0.33E-12 farads/cm with a Vsupply of 0.100 volts:

$$I|_{V_{g=60mv}} = q\mu n \times Q_{mobile}(60mv) \times \frac{W}{L} \times V_{supply} \quad \text{Eq. 3}$$
$$= 192 \text{ microamperes (taking the value of } Q_{mobile}$$
$$\text{from point 84 in Fig. 6a).}$$

$$g_m \equiv \frac{dI}{dV_g}\bigg|_{V_{supply}=const} = \frac{192 \times 10^{-6}}{.040 \text{ volts}} = 4.8 \times 10^{-3} \text{ mhos} \quad \text{Eq. 4}$$

$$C = \frac{\epsilon_{ox} W L}{W_{ox}} = 2.1 \times 10^{-14} \text{ F} \quad \text{Eq. 5}$$

$$f \text{ oper} \sim \frac{g_m}{2\pi C} = 36 \text{ GHZ} \quad \text{Eq. 6}$$

Assuming a fan-out of 3 so that the capacitance of the load $C_{load}$ equals $3 \times C_{gate}$, then for an operating frequency of about 12 GHz:

$$T = \frac{1}{2\pi f_{oper}} = 13 \text{ ps} \quad \text{Eq. 7}$$

$$\text{Power}=I \, V_{supply}=19.2 \times 10^{-6} \text{ watts} \quad \text{(Eq. 8)}$$

$$PT=2.5 \times 10^{-16} \text{ Joules} \quad \text{(Eq. 9)}$$

This is an impressively low value for silicon technology, a value that is this low because with the invention disclosed herein one can operate at very low supply voltages due to the low and well-matched threshold voltages and the very thin gate oxides employed in the logic.

Figure 8:
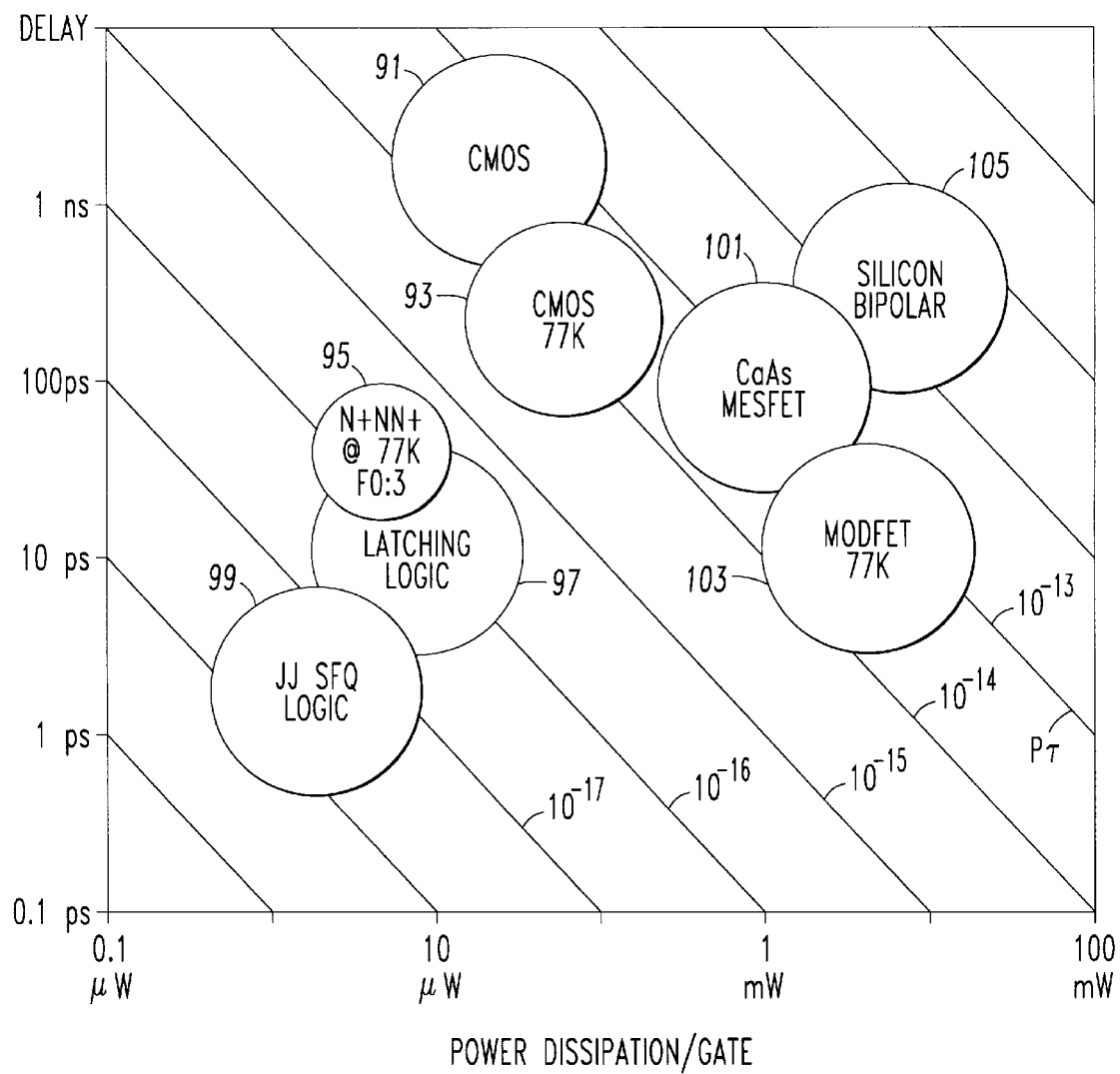
FIG. 8 is a plot of power dissipation versus speed for several semiconductor devices including the invention.

Finally, FIG. 8 illustrates competitive P x TAU products for other devices. Note that CMOS 91 and cooled CMOS 93 have P x TAU products of about 1 to 2E-13 joules, whereas the logic proposed herein 95 has P x TAU products, assuming a fan out of 3, of 2E-16, about 1000x smaller than present silicon devices 91. Note that the 50 ps delays of the proposed devices are nicely matched to the 10 ps delays of the Josephson Junction Latching Logic Series 97. In other words, a stage or two of the transistors described in this invention can amplify the JJ signals up from 1 millivolt to the 40 millivolts needed to drive these devices whereas the difference in delay of a factor of 5 can be made up by a simple 5× multiplexer, again using the 3 Ghz transistors from the proposed invention. FIG. 8 also illustrates the performance of Josephson Junction Single Flux Quantum (JJSFQ) devices 99, as well as gallium arsenide MESFETs 101, cooled MODFETs 103, and silicon bipolar devices 105.

The low power NNN/PPP technology of the invention, offers very attractive silicon-based P x TAU products and speed. A low temperature environment has been described; however, use of the teaching herein should also be beneficial at higher temperatures, although to a lesser degree.

A preferred SOI embodiment is described since such a structure offers attractive DC isolation between the NNN and PPP devices as well as a low total device-to-physical-substrate capacitance. Non-SOI configurations are also possible that take advantages of the teaching herein.

It is important to get the work function difference between the gate 13 and the channel region 2 in FIG. 1 as low as possible. This suggests that the polysilicon gate 13 and the background doping of the P channel region 9 be simultaneously-doped with the same implantation, the voltage of the implantation being chosen to be low enough that the doping of the gate is enough higher than that of the channel so as to guarantee that there is not a voltage drop across the gate due to the (depleting) gate oxide field. This would raise the threshold voltage of the NNNMOST. A compromise is necessary: Heavily doped gates mean no depletion but a larger effect due to work function differences.

The thin 20 Å oxide layer should not be particularly susceptible to tunnelling since the fields are low (1E5 v/cm). Note that the oxide can be increased from 20 Å to 30 Å without affecting the speed (Gm and the Capacitance both essentially increase with Wox) only the power increases, which can be nicely traded against gate leakage due to direct gate oxide tunnelling if needed.

Taking full advantage of the speed of this technology may require using low capacitance lines, perhaps suspended in air as is known in the art.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A semiconductor device comprising:
   a substrate;
   a first active layer on said substrate having a first source region and a first drain region each of a same conductivity type and a first channel region of said same conductivity type between said first source region and said first drain region and having a thickness of no more than about 300 Å;

said first channel region having a predetermined dopant level, and a Debye length associated with said dopant level and wherein said thickness of said first channel region is less than said Debye length;

an oxide layer of no more than about 20 Å in thickness over said first channel region;

a first gate electrode on said oxide layer;

electrodes respectively connected to said first source and drain regions.

2. The semiconductor device of claim 1 wherein said active layer is selected from a group consisting of silicon, silicon carbide, and gallium arsenide.

3. The semiconductor device of claim 1 including an insulating layer between said active layer and said substrate.

4. The semiconductor device of claim 3 in which said channel region of said active layer is about 100 Å thick.

5. The semiconductor device of claim 1 wherein said channel region is about 200 Å thick.

6. The semiconductor device of claim 1 wherein said oxide layer is about 5 to about 10 Å thick.

7. The semiconductor device of claim 6 wherein said channel region has a length between said source and drain regions of about 500 to about 2500 Å.

8. The semiconductor device of claim 7 wherein said channel region has a length of about 1000 to 1500 Å.

9. The semiconductor device of claim 1 wherein said first active layer has said first source region, first drain region and first channel region all of a first conductivity type, a second active layer additionally including a second source region, a second drain region and a second channel region all of a second conductivity type, said first and second channel regions each having a thickness of no more than about 300 Å, an additional oxide layer of no more than about 20 Å in thickness is provided over said second channel region, a second gate electrode is provided on said additional oxide layer over said second channel region, and an electrode is additionally provided for each of said second source and drain regions.

10. The semiconductor device of claim 9 wherein said second active layer is selected from a group consisting of silicon, silicon carbide, and gallium arsenide and an insulating layer is provided between said second active layer and said substrate.

11. The semiconductor device of claim 9 wherein said oxide layers over said first and second channel regions are about 5 to 15 Å thick.

12. The semiconductor device of claim 11 wherein said first and second channel regions each have a length of about 500 to about 2500 Å.

13. The semiconductor device of claim 1, having a threshold gate voltage and wherein the threshold gate voltage is 60 millivolts or less.

14. The semiconductor device of claim 13 wherein the threshold gate voltage is in the order of a few tens of millivolts.

15. The semiconductor device of claim 14 wherein the threshold gate voltage is 20 millivolts.

16. The semiconductor device of claim 1 wherein a small negative polarity on the gate completely depletes the active layer shutting off the current.

17. The semiconductor device of claim 16 wherein the small negative polarity comprises a few millivolts of bias.

* * * * *